United States Patent
Lee et al.

(10) Patent No.: US 8,824,201 B2
(45) Date of Patent: Sep. 2, 2014

(54) SEMICONDUCTOR MEMORY APPARATUS AND DATA READING METHOD THEREOF

(75) Inventors: Hyun Joo Lee, Icheon-si (KR); Dong Keun Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 122 days.

(21) Appl. No.: 12/982,983

(22) Filed: Dec. 31, 2010

(65) Prior Publication Data

US 2012/0051126 A1    Mar. 1, 2012

(30) Foreign Application Priority Data

Aug. 27, 2010   (KR) .................. 10-2010-0083294

(51) Int. Cl.
  *G11C 11/00*    (2006.01)
  *G11C 13/00*    (2006.01)

(52) U.S. Cl.
  CPC .......... *G11C 13/004* (2013.01); *G11C 13/0004* (2013.01); *G11C 13/0002* (2013.01)
  USPC ............ 365/163; 365/148; 365/175; 365/203

(58) Field of Classification Search
  USPC .................................. 365/148, 163, 175, 203
  See application file for complete search history.

(56) References Cited

U.S. PATENT DOCUMENTS

| | | | |
|---|---|---|---|
| 6,909,656 B2 | 6/2005 | Moore et al. | |
| 6,954,385 B2 | 10/2005 | Casper et al. | |
| 7,391,644 B2 * | 6/2008 | Cho et al. | 365/163 |
| 7,440,327 B1 | 10/2008 | Sekar et al. | |
| 8,111,539 B2 * | 2/2012 | Fasoli et al. | 365/148 |
| 2001/0033245 A1 | 10/2001 | Campanale et al. | |
| 2006/0034112 A1 | 2/2006 | Oh et al. | |
| 2006/0181915 A1 * | 8/2006 | Oh et al. | 365/148 |
| 2007/0153569 A1 | 7/2007 | Nirschl et al. | |
| 2009/0225590 A1 | 9/2009 | Oh et al. | |
| 2009/0262573 A1 * | 10/2009 | Choi et al. | 365/163 |

FOREIGN PATENT DOCUMENTS

| KR | 1020050102952 A | 10/2005 |
|---|---|---|
| KR | 1020070048905 A | 5/2007 |
| KR | 100895399 B1 | 4/2009 |

* cited by examiner

*Primary Examiner* — Tha-O H Bui
(74) *Attorney, Agent, or Firm* — William Park & Associates Ltd.

(57) ABSTRACT

A semiconductor memory apparatus includes: a read current supply unit configured to supply a read current; a resistive memory cell configured to pass a current having a magnitude corresponding to a resistance value thereof in a data read mode; a voltage transfer unit coupled between the read current supply unit and the resistive memory cell and configured to transfer the read current to the resistive memory cell, wherein a voltage corresponding to the magnitude of the passed current is formed at a sensing node; and a feedback unit configured to pull-down drive a connection node, which is coupled between the voltage transfer unit and the resistive memory cell, when a voltage level of the sensing node reaches a predefined level.

12 Claims, 3 Drawing Sheets

SEMICONDUCTOR MEMORY APPARATUS AND DATA READING METHOD THEREOF

CROSS-REFERENCES TO RELATED APPLICATION

The present application claims priority under 35 U.S.C. §119(a) to Korean application number 10-2010-0083294, filed on Aug. 27, 2010, in the Korean Intellectual Property Office, which is incorporated herein by reference in its entirety.

BACKGROUND

1. Technical Field

The present invention relates generally to a semiconductor memory apparatus, and more particularly to a technology which detects data stored in a memory cell.

2. Related Art

Phase change random access memory (PCRAM) has the characteristics of non-volatility and random accessability, and it can be highly integrated at low cost. PCRAM stores data by using a phase change material that undergoes a phase change at a certain temperature condition, which in turn changes the resistance of the phase change material.

A phase change material can change to an amorphous state or a crystalline state according to a temperature condition. A representative phase change material is a chalcogenide alloy. A representative chalcogenide alloy is $Ge_2Sb_2Te_5$ composed of germanium (Ge), antimony (Sb), and tellurium (Te). Hence, a phase change material is generally called a "GST".

A phase change material in a PCRAM undergoes a reversible phase change between a crystalline state and an amorphous state by Joule heating generated when a current or voltage is applied to the phase change material under specific conditions. In circuit terms, a crystalline state is referred to as a set state. In a set state, a phase change material has electrical properties substantially equal to those of a metal having a small resistance value. In circuit terms, an amorphous state is referred to as a reset state. In a reset state, a phase change material has a larger resistance value than that in a set state. That is, a PCRAM stores data through a change in a resistance value between a crystalline state and an amorphous state and determines a level of the stored data by sensing a current flowing through a phase change material or a voltage change depending on a current change. Generally, a set state is defined as a logic level '0', and a reset state is defined as a logic level '1'. The set/reset state of a phase change material is continuously maintained even when power is interrupted.

FIG. 1 is a configuration diagram illustrating a memory cell of a conventional PCRAM.

Referring to FIG. 1, a memory cell includes a cell diode D1 and a phase change element GST.

The basic operation of the PCRAM configured as above will be described below.

In particular, an operation of reading data programmed in the phase change element GST is performed as follows.

When a word line WL is enabled to a low level, e.g., a ground voltage, and a read current is transferred through a bit line BL, a cell diode D1 becomes forward biased and turn on after a voltage difference between the anode and cathode of the cell diode D1 is higher than the threshold voltage. A read current path is then formed along the bit line BL, the phase change element GST, and the word line WL, which was enabled to a low level. Therefore, when a predetermined voltage or current is applied to the phase change element GST through the bit line BL, an amount of a current flowing through the phase change element GST or the magnitude of a voltage drop across the phase change element GST is changed depending on the resistance value of the phase change element GST. Using this phenomenon, data stored in the phase change element GST is determined, that is, the state of the phase change element GST is determined.

SUMMARY

In one embodiment of the present invention, a semiconductor memory apparatus includes: a read current supply unit configured to supply a read current; a resistive memory cell configured to pass a current having a magnitude corresponding to a resistance value thereof in a data read mode; a voltage transfer unit coupled between the read current supply unit and the resistive memory cell and configured to transfer the read current to the resistive memory cell, wherein a voltage corresponding to the magnitude of the passed current is formed at a sensing node; and a feedback unit configured to pull-down drive a connection node, which is coupled between the voltage transfer unit and the resistive memory cell, when a voltage level of the sensing node reaches a predefined level.

In another embodiment of the present invention, a data reading method of a semiconductor memory apparatus includes: forming a voltage, which corresponds to a magnitude of a read current passed by a resistive memory cell, at a sensing node; and pull-down driving the sensing node when a voltage level of the sensing node reaches a predefined level.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus and a data reading method according to exemplary embodiments of the present invention will be described below with reference to the accompanying drawings.

For reference, since terms, symbols, and signs that are used in drawings and in this detailed description to designate devices, blocks, and so on may be used for detailed units as the occasion demands, it is to be noted that the same terms, symbols and signs may not designate the same devices, blocks, and so on in an entire circuitry. Also, the logic signals of a circuit and binary data values are divided into a high level (H) or a low level (L) in correspondence to voltage levels and may be represented as '1' and '0'. Furthermore, as the occasion demands, a high impedance state (a high-Z state) may be defined and described.

Figure 1:
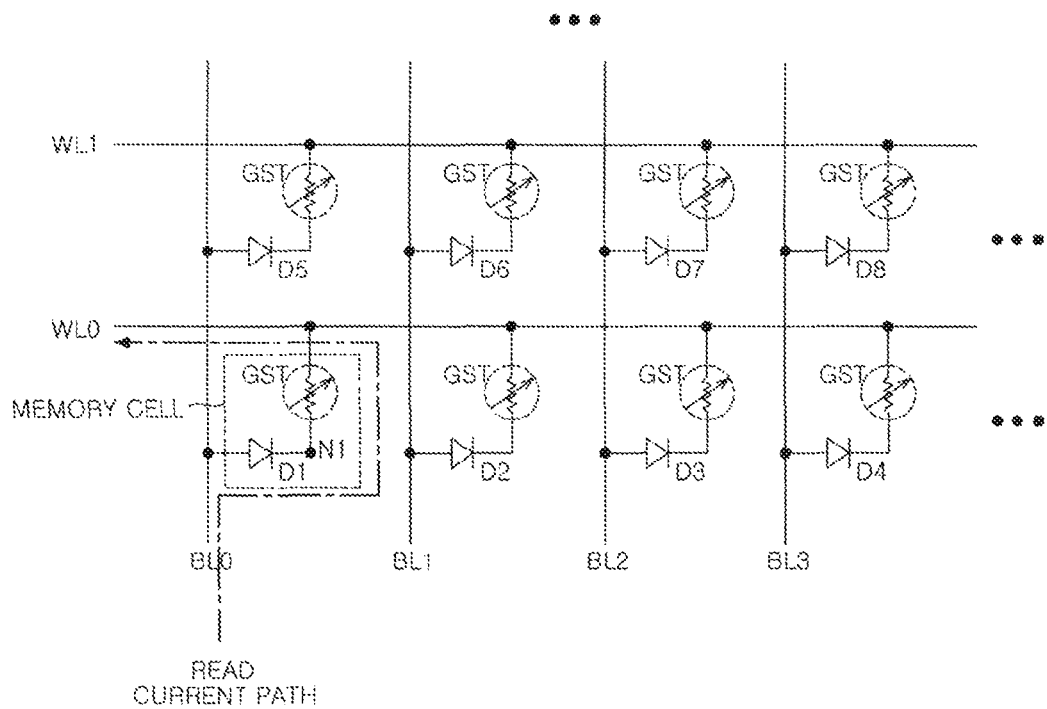
FIG. 1 is a configuration diagram illustrating a memory cell of a conventional PCRAM.
Figure 2:
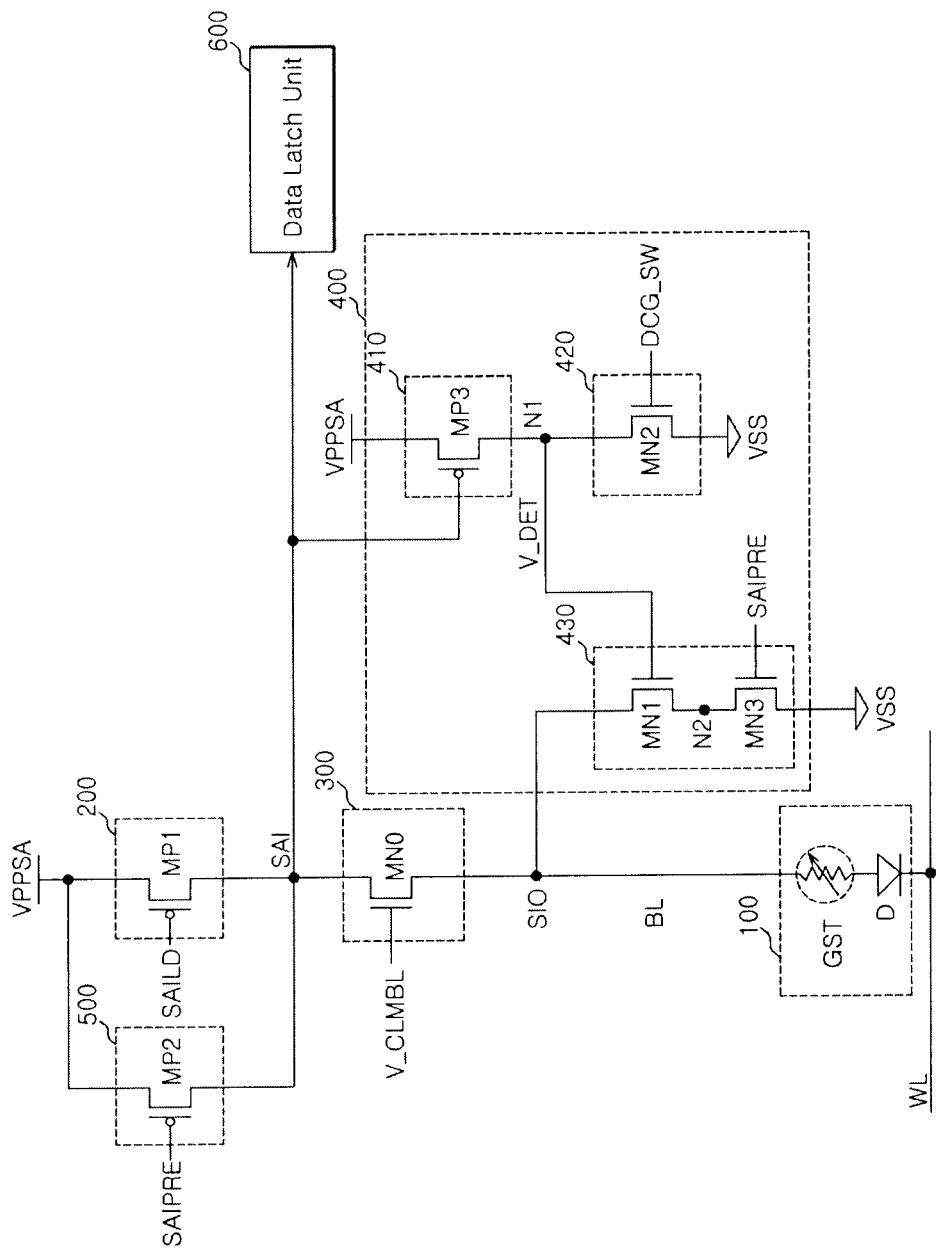
FIG. 2 is a configuration diagram illustrating a semiconductor memory apparatus according to an embodiment of the present invention.

FIG. 2 is a configuration diagram illustrating a semiconductor memory apparatus according to an embodiment of the present invention.

The semiconductor memory apparatus of FIG. 2 according to an embodiment of the present invention is shown in simplified structure to better facilitate the clear explanation of the technical features of the present invention as well as the spirit of the invention intended therein.

Referring to FIG. 2, the semiconductor memory apparatus includes a resistive memory cell 100, a read current supply unit 200, a voltage transfer unit 300, a feedback unit 400, a precharge unit 500, and a data latch unit 600. The precharge unit 500 and the data latch unit 600 may be optionally provided according to embodiments.

The detailed structure and main operation of the semiconductor memory apparatus configured as above will be described below.

In a data read mode, the resistive memory cell 100 passes a current having a magnitude corresponding to a resistance value thereof. In this embodiment, the resistive memory cell 100 is a phase change memory cell including a phase change element GST and a diode D.

The read current supply unit 200 is configured to supply a read current in the data read mode. In this embodiment, the read current supply unit 200 includes a PMOS transistor MP1 which is coupled between an internal voltage terminal VPPSA and a sensing node SAI and controlled by a read current driving signal SAILD.

The precharge unit 500 is configured to precharge the sensing node SAI by using a voltage of the internal voltage terminal VPPSA before the data read mode is started. In this embodiment, the precharge unit 500 includes a PMOS transistor MP2 which is coupled between the internal voltage terminal VPPSA and the sensing node SAI and controlled by a precharge signal SAIPRE.

The voltage transfer unit 300 is coupled between the read current supply unit 200 and the resistive memory cell 100 and configured to transfer the read current to the resistive memory cell 100. A voltage corresponding to the magnitude of the current passed by the voltage transfer unit 300 is then formed at the sensing node SAI by the voltage transfer unit 300. In this embodiment, the voltage transfer unit 300 includes an NMOS transistor MN0 which is coupled between the sensing node SAI and a connection node SIO and controlled by a control voltage V_CLMBL. Since the current drivability of the NMOS transistor MN0 is adjusted according to the voltage level of the control voltage V_CLMBL, it is possible to prevent an excessive read current from being transferred to the bit line BL.

When the resistance value of the resistive memory cell 100 is relatively large, the magnitude of the current flowing through the read current path is very small. Hence, the voltage level of the connection node SIO coupled to the bit line BL is increased higher than an initial level thereof. Since the voltage difference between the gate and source of the NMOS transistor MN0 is small, the NMOS transistor MN0 operates in a saturation region and the voltage level of the sensing node SAI is substantially maintained at an initially precharged voltage level.

On the other hand, when the resistance value of the resistive memory cell 100 is relatively small, the magnitude of the current flowing through the read current path is very large. Hence, the voltage level of the connection node SIO coupled to the bit line BL is increased relatively slightly with respect to the initial level thereof. Therefore, since a voltage difference between the gate and the source of the NMOS transistor NM0 is large, the NMOS transistor operates in a linear region and the voltage level of the sensing node SAI gradually becomes lower than the initially precharged voltage level.

The feedback unit 400 is configured to pull-down drive the connection node SIO, which is coupled between the voltage transfer unit 300 and the resistive memory cell 100, to a ground voltage VSS when the voltage level of the sensing node SAI reaches a predefined level. In this embodiment, the feedback unit 400 includes a voltage detection section 410, a discharge section 420, and a pull-down driving section 430. The voltage detection section 410 is configured to detect the voltage level of the sensing node SAI and output a detection voltage V_DET, which corresponds to the detection result, to a detection voltage terminal N1. In this embodiment, the voltage detection section 410 includes a PMOS transistor MP3 having a gate coupled to the sensing node SAI, a source coupled to the internal voltage terminal VPPSA, and a drain coupled to the detection voltage terminal N1.

The discharge section 420 is configured to discharge the detection voltage terminal N1 to the ground voltage VSS. In this embodiment, the discharge section 420 includes an NMOS transistor MN2 which is coupled between the detection voltage terminal N1 and a ground voltage (VSS) terminal and controlled by a discharge signal DCG_SW. That is, before the voltage detection section 410 detects the voltage of the sensing node SAI and outputs the detection voltage V_DET to the detection voltage terminal N1, the discharge section 420 discharges the detection voltage terminal N1 to the ground voltage VSS and thus resets the pull-down driving section 430 which operates under the control of the detection voltage V_DET. Since the discharge section 420 resets the pull-down driving section 430, it is possible to reduce current consumption caused by an unnecessary pull-down operation of the pull-down driving section 430.

Also, the pull-down driving section 430 is configured to pull-down drive the connection node SIO to the ground voltage VSS according to the voltage level of the detection voltage terminal N1. In this embodiment, the pull-down driving section 430 includes an NMOS transistors MN1 and MN3. The NMOS transistor MN1 has a gate coupled to the detection voltage terminal N1, a drain coupled to the connection node SIO, and a source coupled to a first node N1. The NMOS transistor MN3 has a drain coupled to the first node N2, a source coupled to the ground voltage (VSS) terminal, and a gate receiving the precharge signal SAIPRE.

When the voltage level of the sensing node SAI becomes lower than the initially precharged level, the feedback unit 400 pull-down drives the connection node SIO to the ground voltage VSS. When the connection node SIO is pull-down driven to the ground voltage VSS, the sensing node SAI is also pull-down driven to the ground voltage VSS.

That is, when the resistance value of the resistive memory cell 100 is relatively small, the magnitude of the current flowing through the read current path is very large, and thus the rise width of the voltage level of the connection node SIO coupled to the bit line BL is very small. Therefore, since a voltage difference between the gate and the source of the NMOS transistor MN0 is large, the NMOS transistor MN0 operates in a linear region and thus the voltage level of the sensing node SAI is gradually lowered from the initially precharged voltage level. When the voltage level of the sensing node SAI is lowered to a level enough to turn on the PMOS transistor MP3 of the voltage detection section 410, the pull-down driving section 430 pull-down drives the connection node SIO in response to the detection voltage V_DET and finally pull-down drives the sensing node SAI to the ground voltage VSS.

In the semiconductor memory apparatus according to an embodiment of the present invention, when the resistance value of the resistive memory cell 100 is relatively small, that is, the stored data has a low level, the sensing node SAI is rapidly pull-down driven to the ground voltage VSS by the pull-down driving section 430 at the moment when the voltage level of the sensing node SAI drops to a predefined level. Thus, a read data signal having a low level can be detected more quickly.

The data latch unit 600 is configured to store the read data signal outputted from the sensing node SAI in the data read mode. When the read data signal is at a high level, it is at a level higher than an external power supply voltage VDD. Also, when the read data signal is at a low level, it is at a ground voltage (VSS) level. Therefore, since the voltage difference between the high level and the low level of the read data signal is considered very large, the data latch unit 600 can receive and store the read data signal without separate sensing circuits. Generally, the data latch unit 600 down-converts the high-level read data signal to the power supply voltage (VDD) level and stores the down-converted read data signal.

Figure 3:
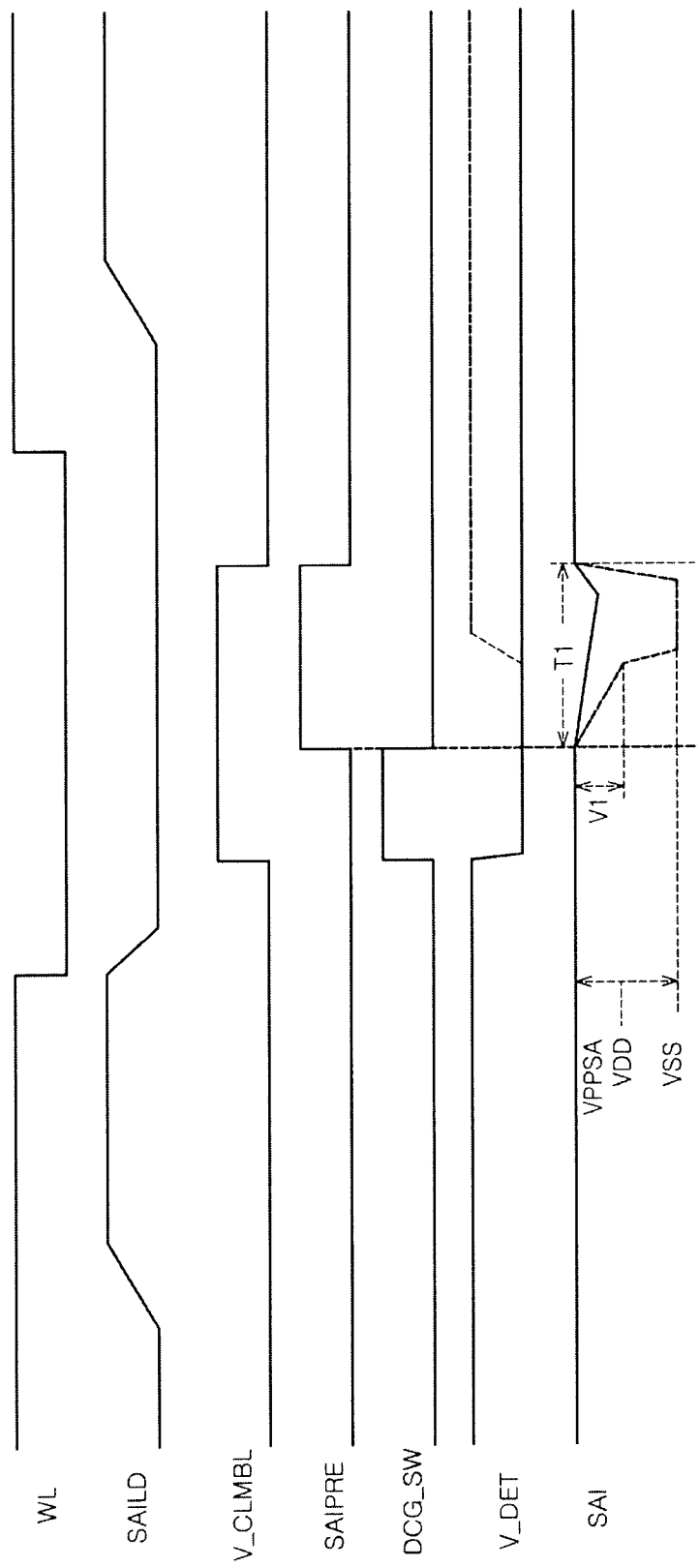
FIG. 3 is a timing diagram illustrating a main internal operation of the semiconductor memory apparatus of FIG. 2.

FIG. 3 is a timing diagram illustrating the main internal operation of the semiconductor memory apparatus of FIG. 2.

The main internal operation of the semiconductor memory apparatus configured as above will be described below with reference to FIGS. 2 and 3.

First, when both the read current driving signal SAILD and the precharge signal SAIPRE are activated to a low level, the sensing node SAI is precharged by the current driven by the precharge unit 500 and the read current supply unit 200. The sensing node SAI is then precharged to the voltage of the internal voltage terminal VPPSA.

Then, the voltage level of the control voltage V_CLMBL would increase, and a high voltage is applied to the gate of the NMOS transistor MN0 of the voltage transfer unit 300. Simultaneously, since the discharge signal DCG_SW is activated to a high level, the detection voltage terminal N1 is discharged to the ground voltage VSS. Therefore, the voltage level of the detection voltage V_DET would also drop to the ground voltage VSS. Thus, it is possible to reduce current consumption caused by an unnecessary pull-down operation of the pull-down driving section 430. Also, since the detection voltage terminal N1 is reset to the ground voltage VSS, the detection voltage V_DET can be generated more stably.

Then, from the point of time when the precharge signal SAIPRE is deactivated to a high level, the voltage levels of the connection node SIO and the sensing node SAI are determined by the resistance value of the resistive memory cell 100. When the resistance value of the resistive memory cell 100 is relatively small, the voltage level of the sensing node SAI would gradually drop. Then, when the voltage level of the sensing node SAI reaches a specific level, the detection voltage V_DET would rise and the pull-down driving section 430 would start the pull-down operation. Therefore, the voltage level of the sensing node SAI drops to the ground voltage VSS. Then, the time T1 taken until the read data signal is outputted to the sensing node SAI would be shortened by the pull-down operation of the pull-down driving section 430. The above-described operation is indicated by dotted lines in the timing diagram of FIG. 3.

Using the feedback unit, the semiconductor memory apparatus according to an embodiment of the present invention would be able to read the data stored in the memory cell at a faster speed and reduce the circuit size thereof.

A data reading method of the semiconductor memory apparatus according to an embodiment of the present invention includes: forming a voltage, which corresponds to a magnitude of a read current passed by the resistive memory cell, at the sensing node; pull-down driving the sensing node when the voltage level of the sensing node reaches a predefined level; and storing a read data signal outputted from the sensing node. The data reading method of the semiconductor memory apparatus may further include precharging the sensing node. The pull-down driving of the sensing node may include: detecting the voltage level of the sensing node and generating the detection voltage corresponding to the detection result; and pull-down driving the sensing node to the ground voltage according to the control of the detection voltage. Meanwhile, the data reading method of the semiconductor memory apparatus may further include discharging the detection voltage terminal, through which the detection voltage is outputted, to the ground voltage before the detection voltage is generated.

The embodiments of the present invention have been described above in detail.

The embodiments of the present invention have been described in detail. For reference, embodiments including additional component elements, which are not directly associated with the technical spirit of the present invention, may be exemplified in order to describe the present invention in further detail. Moreover, an active high configuration or an active low configuration for indicating the activated states of signals and circuits may vary depending upon an embodiment. It is to be understood that, in order to realize the same function, the configurations of logic gates may be changed as the occasion demands. That is to say, NANDing elements, NORing elements, etc. can be configured through various combinations of NAND gates, NOR gates, inverters, and so forth. Since these circuit changes have a large number of cases and can be easily inferred by those skilled in the art, the enumeration thereof will be omitted herein.

While certain embodiments have been described above, it will be understood to those skilled in the art that the embodiments described are by way of example only. Accordingly, the semiconductor memory apparatus and the data reading method thereof described herein should not be limited based on the described embodiments. Rather, the semiconductor memory apparatus and the data reading method thereof described herein should only be limited in light of the claims that follow when taken in conjunction with the above description and accompanying drawings.

What is claimed is:

1. A semiconductor memory apparatus comprising:
   a read current supply unit configured to supply a read current;
   a resistive memory cell having a resistance value and configured to pass a current having a magnitude corresponding to the resistance value thereof in a data read mode;
   a voltage transfer unit coupled to the read current supply unit and the resistive memory cell and configured to transfer the read current to the resistive memory cell, wherein a voltage due to the current flowing through the resistive memory cell is formed at a sensing node; and
   a feedback unit configured to drive in response to the voltage formed at the sensing node, and to detect a voltage level of the sensing node and output a detection voltage, and to pull-down drive a connection node, which is coupled between the voltage transfer unit and the resistive memory cell, when the detection voltage reaches a predetermined level,
   wherein the feedback unit comprises:
      a voltage detection section configured to detect the voltage level of the sensing node and output the detection voltage, which corresponds to a detection result, to a detection voltage terminal; and
      a pull-down driving section configured to pull-down drive the connection node according to a voltage level of the detection voltage terminal, and
   wherein the voltage detection section comprises a first transistor having a gate coupled to the sensing node, a source coupled to an internal voltage terminal, and a drain coupled to the detection voltage terminal.

2. The semiconductor memory apparatus according to claim 1, further comprising a precharge unit configured to precharge the sensing node.

3. The semiconductor memory apparatus according to claim 1, further comprising a data latch unit configured to store a read data signal outputted from the sensing node in the data read mode.

4. The semiconductor memory apparatus according to claim 1, wherein the voltage transfer unit comprises a transistor coupled between the sensing node and the connection node and controlled by a control voltage.

5. The semiconductor memory apparatus according to claim 1, wherein the feedback unit further comprises a discharge section configured to discharge the detection voltage terminal.

6. The semiconductor memory apparatus according to claim 1, wherein the pull-down driving section comprises a second transistor having a gate coupled to the detection voltage terminal, a drain coupled to the connection node, and a source coupled to a ground voltage terminal.

7. The semiconductor memory apparatus according to claim 1, wherein the pull-down driving section comprises:
a second transistor having a gate coupled to the detection voltage terminal, a drain coupled to the connection node, and a source coupled to a first node; and
a third transistor having a drain coupled to the first node, a source coupled to a ground voltage terminal, and a gate receiving a precharge signal.

8. The semiconductor memory apparatus according to claim 1, wherein the resistive memory cell comprises a phase change memory cell.

9. The semiconductor memory apparatus according to claim 1, wherein the resistive memory cell comprises a nonvolatile memory cell.

10. A data reading method of a semiconductor memory apparatus, comprising:
forming a voltage, which corresponds to a magnitude of a read current passed by a resistive memory cell, at a sensing node;
detecting a voltage level of the sensing node by being driven according to the voltage formed at the sensing node, and generating a detection voltage; and
pull-down driving the sensing node when the detection voltage reaches a predefined level,
wherein the pull-down driving the sensing node comprises:
detecting the voltage level of the sensing node and generating the detection voltage corresponding to a detection result; and
pull-down driving the sensing node to a ground voltage according to a control of the detection voltage, and
wherein the pull-down driving of the sensing node further comprises:
discharging a detection voltage terminal, through which the detection voltage is outputted, to the ground voltage before the detection voltage is generated.

11. The data reading method according to claim 10, further comprising:
storing a read data signal outputted from the sensing node.

12. The data reading method according to claim 10, further comprising:
precharging the sensing node.

* * * * *